United States Patent [19]

Matsuyama

[11] Patent Number: 4,995,341
[45] Date of Patent: Feb. 26, 1991

[54] MICROWAVE PLASMA CVD APPARATUS FOR THE FORMATION OF A LARGE-AREA FUNCTIONAL DEPOSITED FILM

[75] Inventor: Jinsho Matsuyama, Nagahama, Japan

[73] Assignee: Canon Kabushiki Kaisha, Tokyo, Japan

[21] Appl. No.: 439,817

[22] Filed: Nov. 21, 1989

[30] Foreign Application Priority Data

Nov. 24, 1988 [JP] Japan ................. 63-294740

[51] Int. Cl.$^5$ ............................... C23C 16/48
[52] U.S. Cl. ........................ 118/723; 156/345
[58] Field of Search ............... 118/723; 156/345

[56] References Cited

U.S. PATENT DOCUMENTS

| | | | |
|---|---|---|---|
| 4,265,730 | 5/1981 | Hirose | 156/345 |
| 4,715,927 | 12/1987 | Johncock | 427/39 |
| 4,785,763 | 11/1988 | Saitoh | 118/723 |
| 4,836,140 | 6/1989 | Koji | 118/722 |

FOREIGN PATENT DOCUMENTS

| | | | |
|---|---|---|---|
| 60-52014 | 3/1985 | Japan | 118/730 |
| 60-128265 | 7/1985 | Japan | 118/728 |

*Primary Examiner*—Richard Bueker
*Attorney, Agent, or Firm*—Fitzpatrick, Cella, Harper & Scinto

[57] ABSTRACT

A microwave plasma chemical vapor deposition apparatus for continuously forming a functional deposited film on a substrate, comprising a substantially enclosed film forming chamber containing means for holding said substrate, said film forming chamber being provided with means for feeding a film-forming raw material gas into said film forming space, said film forming chamber being provided with a microwave introducing window connected to a microwave power source and means for evacuating the film forming space, said film forming chamber being provided with an etching chamber for cleaning said microwave introducing window with an etching gas, said etching chamber having an etching space and being provided with means for feeding an etching raw material gas into said etching space, said etching chamber being provided with means for applying an activation energy into said etching space to excite said etching raw material gas to be said etching gas, characterized in that said microwave introducing window comprises a plurality of concentric cylindrical microwave transmitting windows; one of said plurality of microwave transmitting windows to be exposed in the film forming space is made movable between the film forming chamber and the etching chamber such that the microwave transmitting window previously used in the film forming chamber is cleaned by etching off the film deposited on said microwave transmitting window with the etching gas in the etching chamber while film forming operation being performed in the film forming chamber.

2 Claims, 7 Drawing Sheets

MICROWAVE PLASMA CVD APPARATUS FOR THE FORMATION OF A LARGE-AREA FUNCTIONAL DEPOSITED FILM

FIELD OF THE INVENTION

The present invention relates to an improved microwave plasma chemical vapor deposition apparatus which enables one to form a large-area deposited film usable in semiconductor devices or the like at a high deposition rate.

BACKGROUND OF THE INVENTION

Forming a film of a large-area semiconductor or the like at a high deposition rate at a reduced cost is essential to the improvement of productivity of the production line and the reduction of cost in manufacturing semiconductor devices including photovoltaic devices, optical sensors, electrophotographic photoconductors and liquid crystal driving circuits.

Plasma CVD processes are the most general and preferable processes of forming a large-area semiconductor film by deposition. The plasma CVD process is to decompose a raw material gas to produce plasma causing the formation of a deposited film on a substrate.

Among various plasma CVD processes, glow discharge decomposition process (hereinafter referred to as "GD process") has most widely been used because of its satisfactory plasma control performance and capability of comparatively easily forming a large-area film In the GD process, high RF waves are applied to a raw material gas to decompose the raw material gas in plasma state and the deposition of a film is caused on a substrate. However, the deposition rate of the GD process is not sufficiently high; for example, the deposition rate of the GD process is on the order of 20 Angstrom/sec at the maximum in depositing a hydrogenated amorphous silicon film (hereinafter referred to as "a-Si:H film"). And the GD process is accompanied with a problem that when the supply power is increased to enhance the deposition rate beyond the foregoing limit, in most cases, the quality of the film deteriorates sharply with the increase of the supply power Furthermore, increase in the supply power accelerates the vapor phase reaction excessive, entailing the deposition of a large amount of powdery substances on surfaces, such as the walls of the film forming chamber, other than the surface of the substrate. Such powdery substances leaking from the film forming chamber has the danger of burning and the possibility of falling on the substrate to form a defective film. Although dependent on the type of the raw material gas, and the shape and distance between the electrodes for applying a high RF voltage to the raw material gas, it is one of causes of such a problem that the reduction of the pressure of the gas below 0.1 torr in the GD process is difficult and hence the supply of large power is liable to accelerate the vapor phase reaction excessively. Furthermore, plasma density in the GD process is on the order of $10^{10}/cm^3$ at the highest because the plasma is intercepted.

Recently, the microwave plasma CVD process, which decomposes the raw material gas by microwave energy to produce a plasma of the raw material gas, causing the formation of a deposited film on a substrate, has been used increasingly. Since the microwave plasma CVD process uses microwaves of frequencies higher than those of the high-frequency waves employed in the GD process, discharge occurs at a comparatively low voltage and the density of the plasma is as high as $10^{12}/cm^3$.

In the microwave plasma CVD process, discharge can occur easily even if the pressure of the material gas is, for example, on the order of 10 millitorr, so that the vapor phase reaction is not accelerated excessively, and hence powdery substance is not deposited even if a large power is supplied. Consequently, a semiconductor film of a satisfactory quality can be formed at a high deposition rate. For example, the deposition rate of the microwave plasma CVD process in forming an a-Si:H film is 100 Angstrom/sec or higher.

In the microwave plasma CVD process, transmitting high-energy microwaves through a waveguide and a dielectric window into a film forming chamber is the most prevalent and practical. However, when high-energy microwaves are transmitted through the dielectric window, problems arises in this microwave transmitting method; that is, the decomposed material gas forms a film over the dielectric window, the film falls off the dielectric window onto a substrate on which a film is to be formed, forming defects in a film deposited over the substrate; the film adhering to the dielectric window is heated by the microwaves, cracking the dielectric window or the film formed over the dielectric window reduces the microwave transmittivity of the dielectric window, entailing variation in the deposition rate. These problems become intensified particularly when the energy of the microwaves is increased and the duration of film forming operation is extended.

In some cases, the interior of the film forming chamber is etched after completing the film forming operation to avoid the breakage of the dielectric window and to prevent the reduction of deposition rate, which, however, requires additional time increasing film-formation cycle time and there is the possibility of the components of the etching gas being mixed in a film deposited in the next film-formation cycle to deteriorate the quality of the deposited film.

SUMMARY OF THE INVENTION

Accordingly, it is an object of the present invention to provide an improved microwave plasma CVD apparatus capable of solving the foregoing problems found in conventional plasma CVD apparatus and capable of operating for a long time using high electric power.

The inventor of the present invention has found, through zealous studies to achieve the object of the invention, that, when a microwave plasma CVD apparatus is provided with a plurality of microwave introducing windows including a movable microwave introducing window exposed to a film forming space, the formation of film over the microwave introducing windows can be prevented by moving the movable microwave introducing window to an etching chamber isolated from the film forming chamber and removing the film formed over the movable microwave introducing window by etching during the film forming operation, so that the microwave plasma CVD apparatus is able to operate continuously for film forming operation for an extended period of time.

The present invention has been completed through further studies on the basis of the foregoing finding In one aspect of the present invention, there is provided a microwave plasma CVD apparatus (hereinafter referred to as "MW-PCVD apparatus") for forming a functional deposited film on a substrate, said apparatus comprises a film-forming vacuum chamber having a film forming space and having a substrate holder in said space, said chamber being provided with a microwave introducing window unit for introducing microwave into said film forming space to excite a raw material gas as supplied with the energy of microwave so that a film is deposited on a substrate placed on said substrate holder, and an etching chamber having an etching space isolated from the film forming space. The microwave introducing window unit comprises a plurality of concentric microwave introducing windows, one of which microwave introducing windows being exposed to the film forming space is made movable between the film forming chamber and the etching chamber, and a film deposited on the movable microwave introducing window is removed by etching while the film forming operation is being performed in the film forming chamber.

The MW-PCVD apparatus of the present invention reduces the deposition of a film on the microwave introducing window remarkably and it enables one to continuously carry out the film forming process using a large electric power for a desired long period of time without entailing damages for the microwave introducing window.

The MW-PCVD apparatus of the present invention is not accompanied with such occasion that a film is deposited on the microwave introducing window and the film deposited on the microwave introducing window is removed to contaminate into a film to be deposited on the substrate Further, according to the MW-PCVD apparatus of the present invention, the microwave transmittivity of the microwave introducing window always remains constant and because of this, the deposition rate of a film is stabilized. Further in addition, according to the MW-PCVD apparatus of the present invention, since it is provided with the etching chamber situated separately from the film forming chamber and etching of the microwave introducing window is conducted not in the film forming chamber but in the etching chamber, there is not any occasion for the components of an etching gas to be incorporated into a film to be deposited on the substrate.

The microwave introducing windows employed in the present invention are formed preferably of a dielectric material having a high microwave transmittivity, such as quartz or $Al_2O_3$. The shape of the microwave introducing windows may be cylindrical or circular depending on the mode of microwave transmission In any case, the microwave introducing window unit in the present invention comprises at least a first window having a vacuum-sealed portion, and a second window capable of moving in a vacuum. Desirably, the thickness of the gap between the window capable of moving in a vacuum and the adjacent window is preferably 5 mm or less, more preferably, 2.5 mm or less, most preferably, 1 mm or less in order to prevent the raw material gas from leaking into the gap. In the case where there is a fear that the raw material gas is entered into the gap, it is possible to flow hydrogen gas ($H_2$) or an inert gas such as He gas, Ne gas or Ar gas through the gap. A film formed over the window which moves in a vacuum (hereinafter, referred to as "movable window") is removed by dry etching in the etching space while the movable window moves alternately through the film forming chamber and the etching chamber isolated from the former. Accordingly, film is scarcely formed over the microwave introducing window including the movable window, so that the MW-PCVD apparatus is able to operate continuously for a long period of time using a large electric power at a stable deposition rate without entailing the cracking of the microwave introducing windows.

The film forming chamber and the etching chamber may be isolated from each other so that the raw material gas and the etching gas is not mixed by isolating ducts as shown in FIG. 3 or an isolating gate as shown in FIG. 7. The isolating ducts may be scavenged as shown in FIG. 3 by hydrogen gas or an inert gas, such as He gas, Ne gas or Ar gas. The movable window may be moved continuously or intermittently across the boundary between the film forming chamber and the etching chamber.

In order to remove the film deposited on the microwave introducing window (removable window) by etching using an etching gas in the etching chamber, it is possible to produce the etching gas using the microwave to be introduced into the film forming chamber Other than said activation energy, an activation energy of microwave, RF wave or light may be selectively used. Further, heat energy or an energy of a current of charged particles such as ions may be also selectively used.

As for the manner of introducing microwave into the film forming chamber in the present invention, there can be mentioned, for example, a manner of introducing microwave through a microwave introducing window from a waveguide into the film forming chamber, a manner of introducing microwave through a cylindrical microwave introducing window from an antenna rod extending from a waveguide into the film forming chamber as shown in FIG. 1, etc. The manners may be selectively employed as desired in the present invention. A desired material gas and a desired etching gas may selectively be used in the present invention.

When the isolating ducts as shown in FIG. 3 are employed, the depth of the isolating ducts, namely, the distance between a partition plate and the movable window, is preferably 10 mm or less, more preferably, 5 mm or less, most preferably, 3 mm or less.

The partition plates of the isolating ducts may be formed of a metal, such as a stainless steel, or a dielectric material.

DESCRIPTION OF THE PREFERRED EMBODIMENTS

The present invention will be described hereinafter with reference to MW-PCVD apparatus embodying the present invention and the results of film forming operation of those apparatus, which, however, are intended to illustrate the invention and are not to be construed to limit the scope of the present invention

First Embodiment (FIGS. 1, 2, 3, 4)

Figure 1:
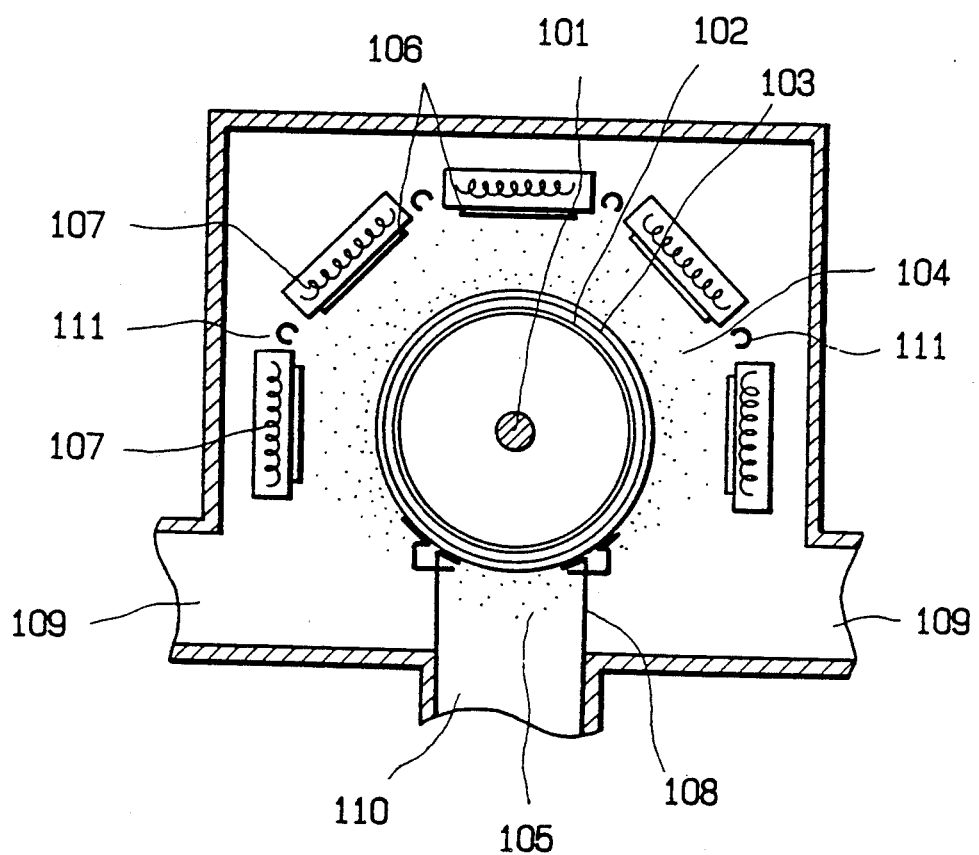
FIG. 1 is a schematic sectional view of a typical MW-PCVD apparatus in an embodiment according to the present invention.

Referring to FIG. 1, a MW-PCVD apparatus in a first embodiment according to the present invention includes a microwave transmitting antenna rod 101 made of a stainless steel, a fixed, cylindrical quartz window (hereinafter, referred to as "fixed window") 102, and a movable, cylindrical quartz window (hereinafter, referred to as "movable window") 103. The MW-PCVD apparatus comprises a film forming chamber having a film forming space 104 and an etching chamber having an etching space 105. Numeral reference 109 stands for a exhaust pipe open into the film forming space 104 at one end and which is connected through an exhaust valve to an exhaust device (not shown).

Figure 2:
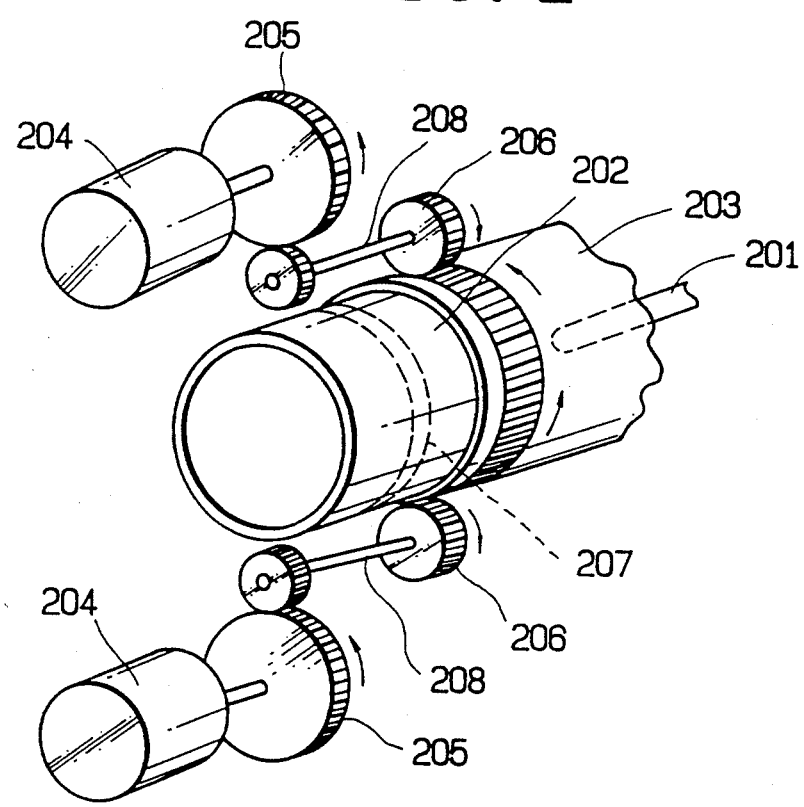
FIG. 2 is a schematic perspective view of a mechanism for rotating a movable window embodying the present invention.

In film forming operation, microwave generated by a microwave oscillator (not shown) is guided by a waveguide (not shown) for propagation and is transmitted through the fixed window 102 and the movable window 103 into the film forming space 104 and the etching space 105 by the microwave antenna rod 101 to create a discharge region A raw material gas is introduced into the film forming space 104 through gas supply manifolds 111 extending from a gas reservoir (not shown) and the raw material gas as introduced is decomposed to cause the formation of a film on substrates 106 heated by electric heaters 107. The movable window 103 exposed to the film forming space 104 is rotated by a mechanism as shown in FIG. 2. Referring to FIG. 2, the movable window 203 is rotated through gears 205 disposed outside the film forming space 104 and gears 206 disposed within the film forming space 104 by motors 204. Gaps between shafts 208 and the wall of a vacuum vessel defining the film forming space 104 are sealed hermetically. The movable window 203 is disposed within the vacuum vessel. The space between the fixed window 202 and the movable window 203 is sealed by an O ring put on the fixed window 202 at a position 207.

Figure 3:
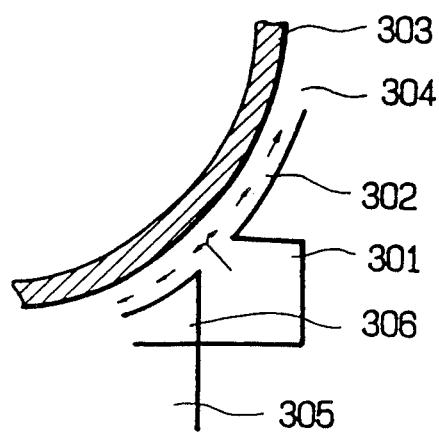
FIG. 3 is a fragmentary view of assistance in explaining a isolating duct embodying the present invention.

Now, referring to FIG. 1, the etching space 105 is isolated from the film forming space 104 by partition plates 108 and isolating ducts as shown in an enlarged view in FIG. 3. Referring to FIG. 3, hydrogen gas is supplied through a supply manifold 301 into the isolating duct 302 to prevent the flow of the film-forming raw material gas into the etching space 105 and the flow of the etching gas into the film forming space 104. The etching gas is supplied through etching gas supply manifolds 306 into the etching space 305. The etching gas is excited in the etching space 305, for example, by microwave to remove a film deposited on the circumference of the movable window 303 by the etching action of the excited etching gas.

Returning to FIG. 1, the movable window 103 is rotated continuously to remove the film deposited thereon in the film forming space 104 by the etching gas in the etching space 105 to prevent cumulative film deposition over the circumference of the movable window 103; consequently, the MW-PCVD apparatus is able to operate stably for a long period of time using high-energy microwave.

Experiment I

The MW-PCVD apparatus as above described was operated in the following manner, to thereby form an a-Si:H film on four aluminum substrates 106 respectively of 75 mm×300 mm in size.

$SiH_4$ gas and $H_2$ gas were introduced through the gas supply manifolds 111 into the film forming space at respective flow rates of 300 sccm and 100 sccm. The gaseous pressure of the film forming space was adjusted to 15 mTorr. And all the substrates 106 were maintained at 250° C. Then, microwave of 2KW was introduced from the antenna rod 101 through the fixed window 102 and the movable window 103 into the film forming space 104 to thereby cause glow discharge in a gaseous mixture composed of said two gases in the space between said plurality of substrates 106 and the movable window 103 in the film forming space 104, whereby a 30 μm thick a-Si:H film on each of the substrates 106.

During the above film forming process, the movable window 103 was rotated continuously at a rotating speed of two turns per minute And, $CF_4$ gas and $O_2$ gas were introduced though the gas supply manifolds 306 (see FIG. 3) into the etching space 105 at respective flow rates of 200 sccm and 20 sccm.

Then, the gaseous pressure of the etching space 105 was maintained at 15 mTorr by exhaust means comprising an exhaust pipe connected through an exhaust valve to an exhaust device which is provided on the side indicated by a numeral reference 110 of the etching space 105 (this part is not shown in FIG. 1). A gaseous mixture composed of said two gases gas excited with the action of the microwave introduced into the etching space 105 from the foregoing antenna rod through the fixed window 102 and the movable window 103 and the film deposited on the movable window 103 was etched off by the excited etching gas In addition, the film forming space 104 and the etching space were isolated from each other by supplying $H_2$ gas into the isolating ducts 302 (see, FIG. 3) at a flow rate of 50 sccm.

In this case, the cylindrical movable window 103 was made 70 mm in radius, 4 mm in thickness and 400 mm in length, the width of the gap between the fixed window 102 and the movable window 103 was made 1 mm, and the size of the gaps between the circumference of the movable window 103 and the isolating ducts 301 was made 2 mm.

Figure 4:
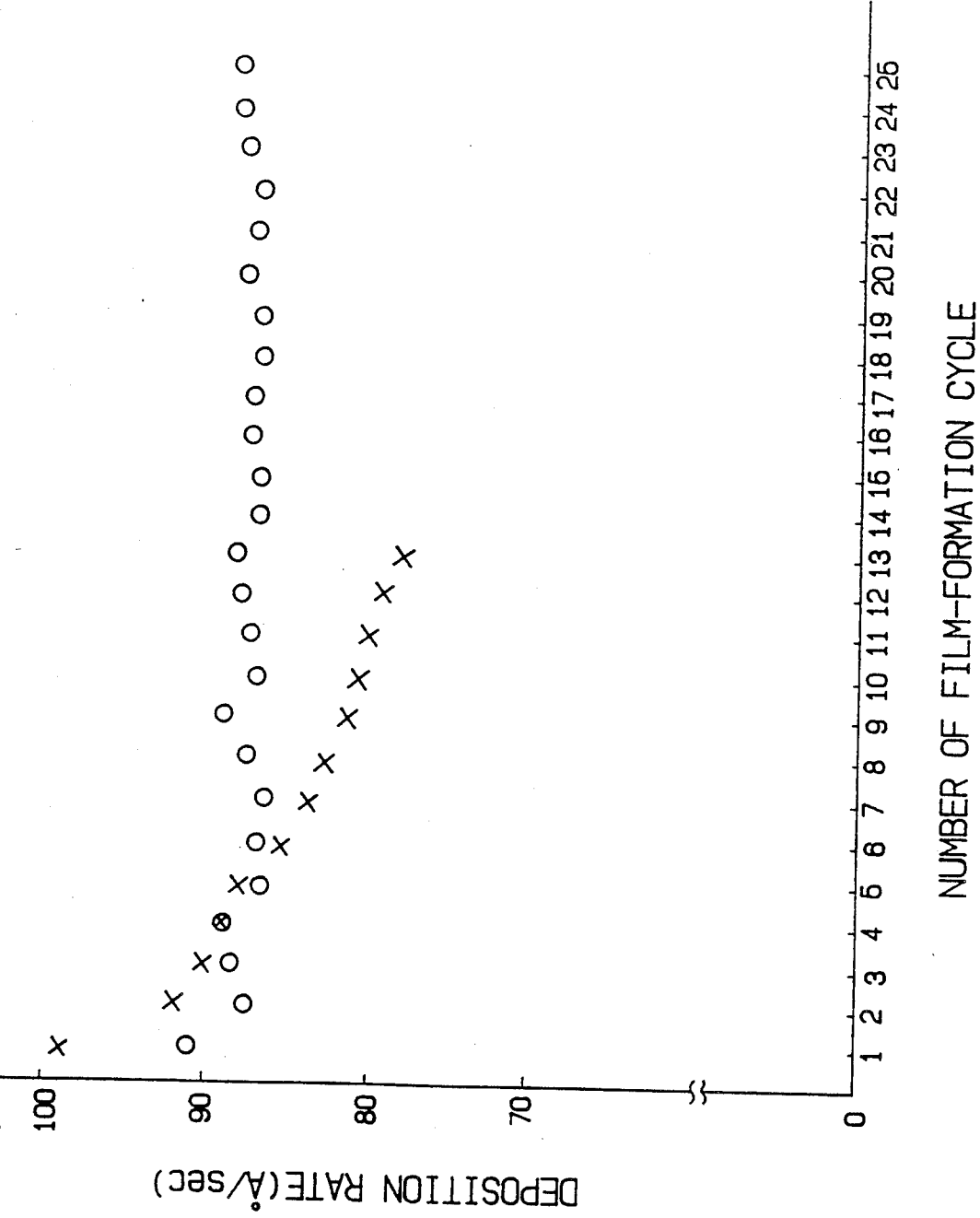
FIG. 4 is a graph showing the variation of deposition rate with the number of film formation cycles obtained through the operation of a MW-PCVD apparatus embodying the present invention.

FIG. 4 illustrates the resultant situations with respect to the variation in the film deposition rates in the cases of having carried out the above process of forming said 30 μm thick a-Si:H film twenty five times.

In FIG. 4, the plots represented by circles indicate the results obtained when the MW PCVD apparatus of the present invention was used, and those represented by crosses indicate the results obtained by carrying out the foregoing film forming process with the use of a MW-PCVD apparatus having substantially the same in constitution except that it is provided with neither the movable window 103 nor the etching space 105 as a comparison.

As shown in FIG. 4, in the case of the comparison, which is not provided with neither the movable window nor the etching space, the film deposition rate decreased as the number of film-formation cycles increased, and the fixed window (a quartz tube) was broken in the fourteenth film-formation cycle due to the adverse influence of the film deposited on the circumference of the fixed window. On the other hand, in the case of the MW-PCVD apparatus of the present invention, the film deposition rate remained substantially constant and neither the movable window nor the fixed window was broken.

Figure 5:
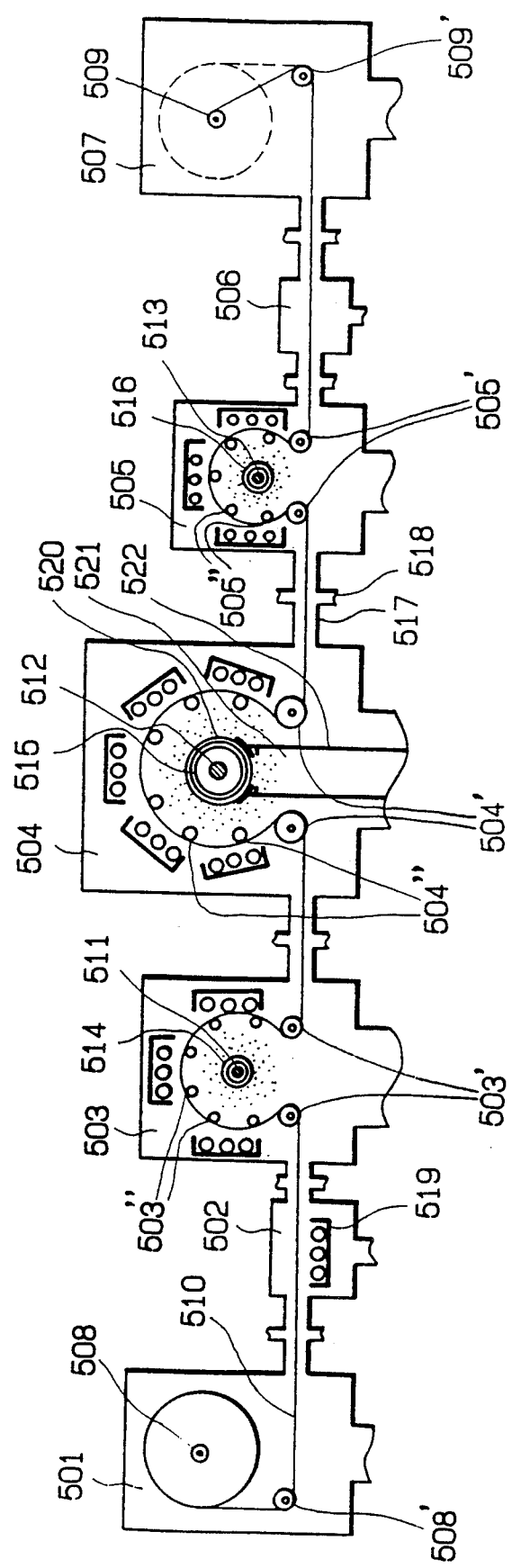
FIG. 5 is a schematic sectional view of a MW-PCVD apparatus in another embodiment according to the present invention.
Figure 6:
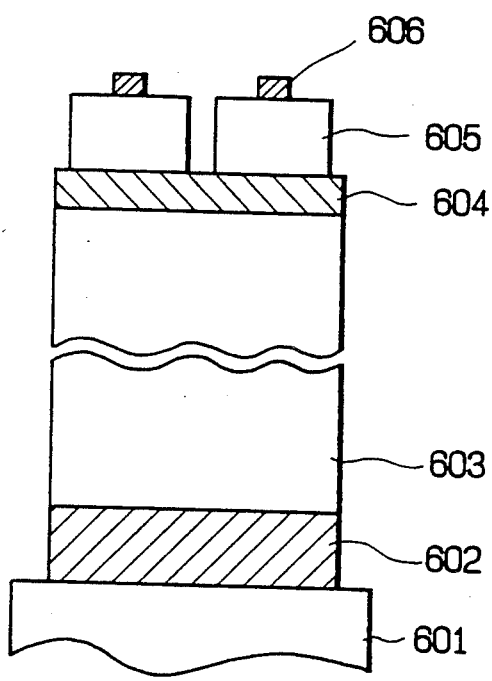
FIG. 6 is a schematic sectional view showing the configuration of a device fabricated by using the MW-PCVD apparatus of FIG. 5.
Figure 7:
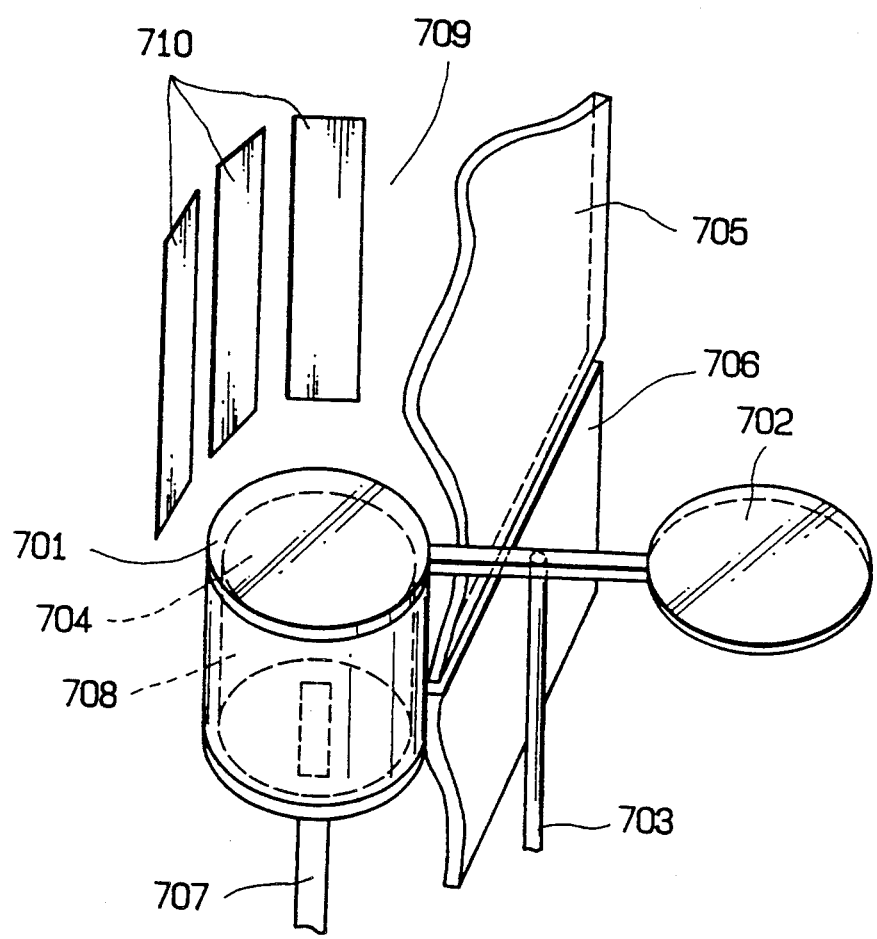
FIG. 7 is a fragmentary perspective view of a MW-PCVD apparatus in a further embodiment according to the present invention.

Second Embodiment (FIGS. 5, 6, 7)

In FIG. 5, there is shown a second embodiment of the MW-PCVD apparatus according to the present invention for continuously forming a functional deposited film on a substrate web which comprises a plurality of film forming chambers, at least one of which comprising the MW-PCVD apparatus of the present invention having substantially the same constitution as that shown in FIG. 1 to 3.

The MW-PCVD apparatus shown in FIG. 5 comprises a substrate feed chamber 501, a first MW-PCVD chamber 503, a second MW-PCVD chamber 504, a third MW-PCVD chamber 505 and an unload chamber 507 being arranged in this order.

The substrate feed chamber 501 contains a payout reel 508 having a web substrate 510 wound thereon and a feed roller 508'.

The unload chamber contains a takeup reel and a feed roller 509'. The web substrate 510 is continuously unwound from the payout roll 508, fed into the first, second and third MW-PCVD chambers where a first, second and third constituent layers are respectively formed thereon, finally fed into the unload chamber 507 where it is wound up on the takeup reel through the feed roller 509'.

The adjacent chambers are separated one from the other by a gas separating duct 517 having a gas gate 518 through which an inert gas is passed in order to prevent each of the gases of the adjacent chambers from reversly flowing from one into the other.

There is provided a preheating chamber 502 for heating the substrate web 510 in advance prior to entrance into the first MW-PCVD chamber to a desired temperature. The preheating chamber 502 contains means for heating the substrate web 510. The preheating chamber 502 is provided with an exhaust pipe being connected to a vacuum pump in order to maintain the inner pressure thereof at a desired value (not shown in the figure). The inside of the preheating chamber 502 is filled with the foregoing inert gas. Likewise, each of the substrate feed chamber 501 and the unload chamber 507 is provided with an exhaust pipe (not shown) and it is filled with the foregoing inert gas. There is provided a cooling chamber 506 between the third MW-PCVD chamber 505 and the unload chamber 507 which is provided with means for cooling the substrate web 510 having a plurality of layers being formed thereon to a room temperature or below. The cooling chamber 506 is provided with an exhaust pipe being connected to a vacuum pump in order to maintain the inner pressure thereof at a desired value (not shown in the figure). The cooling chamber 506 is filled with the foregoing inert gas.

Each of the first and third MW-PCVD chambers has a cylindrical film-forming space encircled by the substrate web supported by a pair of external feed rollers (503', 504' or 505') and a plurality of internal feed rollers (503", 504" or 505").

And in each case of the first and third MW-PCVD chambers, at the center position of the cylindrical film-forming space, there is provided microwave introducing means comprising a microwave transmitting antenna (511 or 513) and a fixed cylindrical quartz window (514 or 516) as well as in the case of the foregoing first embodiment. Each of the first and third MW-PCVD chambers is provided with means for externally heating the substrate web and an exhaust pipe being connected through an exhaust valve to an exhaust device (not shown). Each of the first and third MW-PCVD chambers is provided with means for supplying a raw material gas into the film-forming space (not shown).

The second MW-PCVD chamber is provided with microwave introducing means comprising a microwave transmitting antenna 512, a fixed cylindrical quartz window 515 and a movable cylindrical quartz window 520 at the center position of the film-forming space, to which microwave introducing means an etching chamber having an etching space 521 for etching the movable window 520 with an etching gas which is defined by partition plates 522.

This situation is the same as in the foregoing first embodiment. The second MW-PCVD chamber is provided with means for externally heating the substrate web 510 and an exhaust pipe being connected through an exhaust valve to an exhaust device (not shown). The MW-PCVD chamber is provided with means for supplying a raw material gas into the film-forming space (not shown).

Experiment II

Using the above apparatus, there was prepared a pin type solar cell having the configuration shown in FIG. 6. In FIG. 6, there are shown a substrate 101 (which functions also as a lower electrode), an n type layer 602, an i-type layer 603, a p-type layer 604, an upper electrode 605 and a collecting electrode 606.

In this experiment, as the substrate web, there was used an aluminum web.

Firstly, a roll of an aluminum web wound on the payout reel 508 was provided It was set to the substrate feed chamber 501. The aluminum web was unwound, passed through the preheating chamber 502, the first MW-PCVD chamber 503, the second MW-PCVD chamber 504, the third MW-PCVD chamber 505 and the cooling chamber 506, then fixed to the takeup reel 509 in the unload chamber 507.

Then, air of all the inside spaces of the apparatus were replaced by an inert gas and the aluminum web 510 which had been exposed to the air was wound up by the takeup reel 509. During this process, an inert gas was supplied at a desired gaseous pressure into each of the gas gates 518 in the perpendicular direction and the portion of the aluminum web 510 to be placed in the first MW-PCVD chamber 503 was heated to a temperature of 280° C. by actuating the heating means 519 comprising infrared lamp of the preheating chamber 502. $SiH_4$ gas, $H_2$ gas and $PH_3$ gas (diluted with $H_2$ gas to 3000 ppm) were fed into the first MW-PCVD chamber 503 at respective flow rates of 100 sccm, 100 sccm and 50 sccm while maintaining the aluminum web positioned in the first MW-PCVD chamber at 280° C. After the flow rates of all the gases became stable, the gaseous inner pressure was adjusted to 10 mTorr by regulating the exhaust valve of the exhaust pipe. Then, microwave of 300 W was applied through the microwave introducing means into the film-forming space to thereby cause glow discharge, whereby an about 300 Å thick n-type a-Si:H film as the n-type layer 602 is formed on the aluminum web.

Thereafter, the aluminum web 510 was moved again so that its portion having the above n-type a-Si:H film formed thereon was positioned in the second MW-PCVD chamber 504. The aluminum web was maintained at a temperature of 280° C. Then, SiH$_4$ gas and H$_2$ gas were fed into the second MW-PCVD chamber at respective flow rates of 400 sccm and 100 sccm. After the flow rates of the two gases became stable, the gaseous inner pressure of the film-forming space was adjusted to 15 mTorr and microwave of 2KW was applied through the microwave introducing means into the film-forming space to thereby cause glow discharge. During this process, the movable window 521 was rotated at a rotating speed of 1.5 times per minute, and NF$_3$ gas was fed into the etching space 521 at a flow rate of 150 sccm and the gaseous inner pressure of the etching space was maintained at 15 mTorr to thereby etch off a film deposited on the movable window.

Thus, there was formed an about 4500 Å thick nondoped i-type a-Si:H film as the i-type layer 603 on the previously formed p type layer.

Then, the aluminum web 510 was moved so that its portion having the above two layers laminated thereon was positioned in the third MW-PCVD chamber 505 The aluminum web was maintained at a temperature of 250° C. Then, SiH$_4$ gas, H$_2$ gas and B$_2$H$_6$ gas (diluted with H gas to 1%) were fed into the film-forming space at respective flow rates of 50 sccm, 200 sccm and 50 sccm. After the flow rates of all the gases became stable, the gaseous inner pressure of the film-forming space was adjusted to 7 mTorr and microwave of 700 W was applied into the film forming space to thereby cause glow discharge. Thus, there was formed an about 100 Å thick p-type microcrystalline Si:H film as the p-type layer 604 on the previously formed i-type a-Si:H layer. Thereafter, the portion of the aluminum web 510 having the above three layers laminated thereon was moved into the cooling chamber 506 to cool sad portion to room temperature and the thus cooled portion was moved into the unload chamber 507. Then, said portion was cut off and transferred into a conventional CVD chamber where a about 700 Å thick ITO film as the collecting electrode 605 was formed on the p type layer 604. And a about 1 μm thick Cr film as the upper electrode 606 was disposed on the collecting electrode 605.

Thus, there was obtained a solar cell having the configuration shown in FIG. 6.

The above procedures were continuously repeated to thereby obtain a plurality of solar cells respectively having the configuration shown in FIG. 6.

The resultant solar cells were evaluated and as a result, it has been found that the solar cells obtained until 24 hours lapsed when the above procedures were continuously repeated exhibit about 10% or at least 9% of photoelectric conversion efficiency and they are practically acceptable. But the solar cells obtained thereafter are not practically acceptable because they do not exhibit a satisfactory photoelectric conversion efficiency, and their n-type and p-type layers are contaminated with foreign matters and inferior in the film quality.

Separately, the foregoing film-forming procedures were continuously repeated to prepare a plurality of solar cells respectively having the configuration shown in FIG. 4 where the microwave introducing window 514 of the first MW-PCVD chamber 503 and the microwave introducing window 516 of the third MW-PCVD chamber 505 were replaced by new ones by suspending the film-forming procedures when 24 hours lapsed. Thus, there were obtained practically acceptable solar cells continuously.

Figure 8:
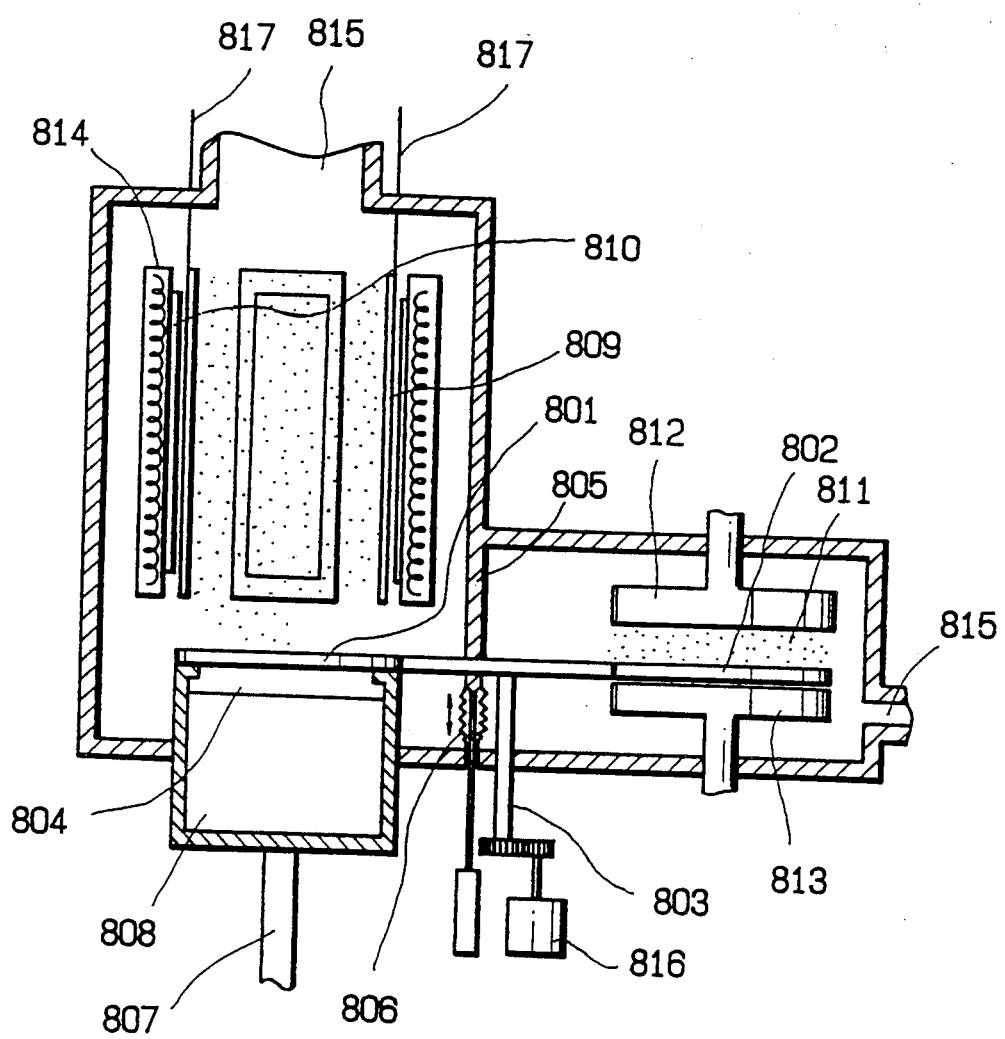
FIG. 8 is a schematic sectional view of the MW-PCVD apparatus of FIG. 7.

Third Embodiment (FIGS. 7, 8)

A MW-PCVD apparatus in a third embodiment according to the present invention shown in FIGS. 7 and 8 is characterized by a pair of flat movable windows 701 and 702 having identical shapes and attached respectively to the opposite ends of a swing arm supported for swing motion at the middle point thereof by a rotary shaft 703. One of the pair of movable windows 701 and 702 is disposed within a film forming space while the other is disposed within an etching space.

Referring to FIG. 8 while also referring to FIG. 7, microwave generated by a microwave oscillator, not shown, are propagated into a cavity 808 (708) by a waveguide 801 (701). The microwaves are transmitted through a fixed alumina window 804 (704) and a movable alumina window 801 (701) into a film forming space 809 (709) to excite and decompose a raw material gas to form a deposited film on a substrate 810 (710) heated by a heater 814. After the completion of one film-formation cycle, a movable gate 806 (706) is lowered, the rotary shaft 803 (703) is turned through an angle of 180° to replace the alumina window 801 (701) with the alumina window 802 (702) to place the alumina window 801 (701) outside the film forming space 809 (709), namely, in the etching space 811, and to place the alumina window in the film forming space 809 (709), and then the movable gate 806 (706) is raised to its initial position. During the subsequent film formation cycle, the alumina window 801 (701) is subjected to the etching action of an etching gas excited by RF wave applied across parallel flat electrodes 812 and 813 in the etching space 811 separated from the film forming space 809 (709) by the movable gate 806 (706) and a fixed gate 805 (705) to remove a film formed over the surface of the alumina window 801 (701). Thus, this MW-PCVD apparatus does not require an additional time for etching, so that the MW-PCVD apparatus is able to operate at a high rate of operation.

Since the film forming space 809 (709) and the etching space 811 are isolated perfectly from each other, the contamination of the components of the etching gas into the film formed on the substrate 810 (710) is prevented.

Experiment III

Using the above MW-PCVD apparatus, there was formed an a-Si:H film in the way as follows.

SiH$_4$ gas and H$_2$ gas were fed through a gas supply pipe 817 into the film forming space 809 at respective flow rates of 300 sccm and 100 sccm and the gaseous pressure of the film forming space 809 was maintained at 10 mTorr. Then, microwave of 1.5 KW was applied through the fixed alumina window and the movable alumina window into the film forming space 809 to thereby cause plasma discharge, whereby an a-Si:H film of 20 μm in thickness was formed on an aluminum substrate maintained at 250° C. During this process, ClF$_3$ gas was fed into the etching space 811 at a flow rate of 300 sccm and the gaseous pressure of the etching space 811 was maintained at 0.6 Torr. Then, RF wave of 150 W was applied across the parallel flat electrodes 812 and 813 to cause plasma discharge and excite the ClF$_3$ gas, whereby the film deposited on the previously used movable alumina window was etched off with the action of the excited ClF$_3$ gas. In this way, there were repeatedly formed a plurality of 20 μm thick a-Si:H films. In each case, the deposition rate of the a-Si:H film was 70 Å/sec±3%.

The same MW-PCVD apparatus was operated without using the movable alumina windows 802 and 805 as a comparison. In this case, the fixed alumina window had to be cleaned by etching using an etching gas ClF$_3$ after every film-formation cycle in order to maintain the deposition rate at 70 Å/sec±3%. In this way, there were repeatedly formed a plurality of 20 μm thick a-Si:H films.

The films formed by the MW-PCVD apparatus provided with the movable alumina windows and the film formed by MW-PCVD apparatus not provided with the movable alumina windows were analyzed by a SIMS. Cl was detected in the films formed by the MW-PCVD apparatus not provided with the movable alumina windows, while no Cl was detected in the films formed by the MW-PCVD apparatus of the present invention. There were repeatedly formed a plurality of 20 μm thick a-Si:H films by repeating the above procedures except for using a gaseous mixture of CF$_4$ and O$_2$ for etching. Each of the resultant films was examined in the same manner as in the above. As a result, it was found that each of the a-Si:H films formed in the case of the comparison contained both C and O respectively with a concentration of about $5 \times 10^{17}$ cm$^{-3}$ and its electron spin density measured by ESR was about $5 \times 10^{16}$/cm$^{-3}$, while each of the a-Si:H films formed by the MW-PCVD apparatus of the present invention contained C or/and O with a negligible concentration, and its electron spin density was not more than $5 \times 10^{15}$/cm$^{-3}$. Further, the a-Si:H films formed by the MW-PCVD apparatus of the present invention had only a few dangling bonds.

As is apparent from the foregoing description, the MW-PCVD apparatus according to the present invention is provided with the fixed window and the movable window exposed to the film forming space, and the movable window is cleaned in the etching space isolated from the film forming space during the film forming operation. Accordingly, the initial microwave transmittivity of the movable window is maintained in a desirable state so that the MW-PCVD apparatus enables one to continuously operate the film forming operation for a desired period of time. Furthermore, since the initial microwave transmittivity of the movable window is maintained, the deposition rate is stabilized at a desired deposition rate. There is not such an occasion for the MW-PCVD apparatus of the present invention that the film formed on the microwave transmitting window falls onto the substrate to cause defects for the film formed on the substrate.

Further, since the movable window is etched in the etching space isolated from the film forming space during the film forming operation, the MW-PCVD apparatus does not require an additional time for cleaning the movable window and is able to operate at a high rate of operation.

What is claimed is:

1. A microwave plasma chemical vapor deposition apparatus for continuously forming a functional deposited film on a substrate, comprising (a) a substantially enclosed film forming chamber containing means for holding said substrate, said film forming chamber including (b) means for feeding a film-forming raw material gas into a film forming space contained within said film forming chamber, (c) means for evacuating said film forming space, (d) a microwave introducing window means connected to a microwave power source; (e) an etching chamber for cleaning said microwave introducing window with an etching gas; said etching chamber including (f) an etching space, (g) means for feeding an etching raw material gas into said etching space, and (h) means for applying an activation energy into said etching space to excite said etching raw material gas to convert it into said etching gas, wherein said microwave introducing window means comprises:

(i) at least one fixed cylindrical microwave transmitting window;
    (ii) a movable cylindrical microwave transmitting window concentrically disposed about said at least one fixed window; means for rotating said movable cylindrical microwave transmitting window between the film forming chamber and the etching chamber, whereby a portion of the movable microwave transmitting window is cleaned in the etching chamber by etching off any film deposited on said movable microwave transmitting window with the etching gas in the etching chamber and a second etched portion of said movable microwave transmitting window is rotated to a position in the film forming chamber from said etching chamber.

2. The apparatus according to claim 1, wherein a plasma generation region created around said movable cylindrical microwave transmitting window is encircled by the surfaces of a plurality of substrates on which a film is to be formed.

* * * * *